(12) United States Patent
Cadena et al.

(10) Patent No.: US 10,295,566 B2
(45) Date of Patent: May 21, 2019

(54) METHOD OF PROVIDING A HIGH DENSITY TEST CONTACT SOLUTION

(71) Applicant: dpiX, LLC, Colorado Springs, CO (US)

(72) Inventors: Kevin Cadena, Pueblo, CO (US); Kevin Granaas, Colorado Springs, CO (US); John Luther, Colorado Springs, CO (US); Shawn Michael O'Rourke, Colorado Springs, CO (US)

(73) Assignee: DPIX, LLC, Colorado Springs, CO (US)

( * ) Notice: Subject to any disclaimer, the term of this patent is extended or adjusted under 35 U.S.C. 154(b) by 246 days.

(21) Appl. No.: 15/428,995

(22) Filed: Feb. 9, 2017

(65) Prior Publication Data

US 2017/0242056 A1   Aug. 24, 2017

Related U.S. Application Data

(60) Provisional application No. 62/297,701, filed on Feb. 19, 2016.

(51) Int. Cl.
  *G01R 1/073*  (2006.01)
  *G01R 31/26*  (2014.01)
  *G01R 31/28*  (2006.01)

(52) U.S. Cl.
  CPC ....... *G01R 1/0735* (2013.01); *G01R 31/2601* (2013.01); *G01R 31/2642* (2013.01); *G01R 31/2886* (2013.01); *G01R 31/2808* (2013.01); *G01R 31/2831* (2013.01); *G01R 31/2851* (2013.01)

(58) Field of Classification Search
  CPC ... G01R 1/00; G01R 1/01; G01R 1/06; G01R 1/067; G01R 1/073; G01R 1/07307; G01R 1/07342; G01R 1/0735; G01R 31/00; G01R 31/28; G01R 31/2801; G01R 31/2806; G01R 31/2808; G01R 31/2851; G01R 31/2886; G01R 1/0491; G01R 31/26; G01R 31/2642; G01R 31/2648; G01R 31/2831; G01R 31/318511; G01R 31/318513
  USPC ......... 324/500, 537, 754.01, 754.03, 754.07, 324/756.01, 756.03, 762.01, 762.02, 324/762.03, 762.05, 762.06
  See application file for complete search history.

(56) References Cited

U.S. PATENT DOCUMENTS

| | | | | |
|---|---|---|---|---|
| 4,414,553 | A | * 11/1983 | Perna | B41J 2/14201 347/40 |
| 5,604,446 | A | * 2/1997 | Sano | G01R 1/0735 324/754.16 |
| 5,945,834 | A | * 8/1999 | Nakata | G01R 1/0491 324/750.05 |

(Continued)

*Primary Examiner* — Hoai-An D. Nguyen
(74) *Attorney, Agent, or Firm* — Slater Matsil, LLP (57) ABSTRACT

A flexible probe card according to the present invention includes a compression layer; a transport layer coupled to the compression layer; and a contact layer coupled to the transport layer. The compression layer is formed of encapsulated closed cell polyurethane foam. The transport layer includes connectors for coupling the flexible probe card to a tester. The contact interface layer includes embedded conductive wires placed in a fixed grid pattern in a silicon rubber layer, without a specific connector pattern associated either with the transport layer or a device under test.

20 Claims, 12 Drawing Sheets

(56) References Cited

U.S. PATENT DOCUMENTS

2006/0186904 A1\* 8/2006 Natsuhara .......... G01R 31/2886
324/750.03
2009/0111903 A1\* 4/2009 Savino ................ C08G 18/10
521/160

\* cited by examiner

METHOD OF PROVIDING A HIGH DENSITY TEST CONTACT SOLUTION

RELATED APPLICATIONS

The present application relates to and claims priority of U.S. provisional patent application ("Copending Provisional Application"), Ser. No. 62/297,701, filed on Feb. 19, 2016. The disclosure of the Copending Provisional Application is hereby incorporated by reference in its entirety.

BACKGROUND OF THE INVENTION

Field of the Invention.

The present invention generally relates to testing of semiconductor devices, and, more particularly, to a method and test probe card for testing large format semiconductor devices, such as flat panel image sensor devices.

Relevant Background.

Current state of the art methods of testing semiconductor devices require a means of providing temporary electrical contacts to the device under test without damaging the connection surfaces that will later be used in the device packaging after successful testing of device.

Current Semiconductor Industry temporary test contact technologies consist of two basic methods including Probe Cards and Flexible Circuits.

Probe Cards are now discussed. This test contact method utilizes a mechanical assembly that serves as an interface between an electronic test system and the Device Under Test, herein known as "DUT". Typically the probe card is mechanically docked to a prober and electrically connected to a tester. Its purpose is to provide an electrical path between the test system and the circuits on the wafer, thereby permitting the testing and validation of the circuits at the wafer level, usually before they are diced and packaged. This probe head generally utilizes machined alloy housings combined with a rigid circuit board that will contain many individual mechanical pins that each serves as a contact point for a single device line to be tested. Each probe can contain as few as ten to twenty contact pins, or up to thousands of total pins depending on the specific application. Probe cards are broadly classified into three types:

Needle type: These pins are made from wire with bends to provide upward resisting spring force when moved into contact with the DUT.

Vertical type: These pins are also made from wire but are placed in a vertical orientation with the beam rigidity of the wire serving as the spring loading force for the pin contacts. These types of cards generally have a design where each pin will have its own spring loaded housing, also known as pogo pins.

MEMS (Micro Electro-Mechanical System) type depending on shape and forms of contact elements. MEMS type is the most advanced technology currently available. This most advanced type of probe card currently can test an entire 12" wafer with one touchdown. The micro-machined nature of this type of contact method makes this solution very expensive.

Because each probe card is manufactured to very exact tolerances for pin placements in all axes, all three types of probe cards are very expensive to build and to maintain and are not scalable to different product sizes without all new tooling. Additionally, manufacturers will typically require a new probe card for each new device to be tested due to the unique footprint for each product layout; this can be a very significant cost factor when many different product layouts must be tested.

Flexible Circuits are now discussed. This test contact method utilizes a Polyimide based flexible circuit with exposed trace lines that are pressed against the DUT contact lines by applying downward pressures using an air initiated or solid tube. This temporary contact then serves as an interface between the electronic test system and the DUT. Typically the flexible circuit is held in position by being glued to a mechanical block that has the ability to be correctly positioned using extraneous hardware incorporated with the block mounting design. Each flexible circuit can contain as few as 80 contact trace lines or up to 256 lines depending on the specific application. This design is very low cost per contact line when compared to probe cards. This design also offers advantages of having the ability to replace and align an individual flex assembly very quickly when compared to probe card based test heads. This design approach also can have numerous disadvantages:

Poor Contact Performance related to surface area. Since electrical contact is being achieved by pressing together two basically flat surfaces, intermittent contact performance can be problematic. A general rule of thumb is that as contact surface area decreases, so does contact performance.

Poor Contact Performance related to deterioration or damage of contact trace lines on product. The flexible circuits used for temporary test contact can become contaminated or damaged, or in some cases be very abrasive/rough, which in turn will damage the contact trace surfaces of DUT which greatly limits the number of head down contacts that result in adequate test contact performance needed to successfully complete testing.

Poor Contact Performance related to alignment of flex assemblies. For each test head aligned there can be reduced contact performance due to positioning differences between flex assemblies. The more accurate the alignment of the entire group of flexes per test head, the greater the tool positioning error that can be tolerated and still achieve usable contact performance. A general rule of thumb is: as the pitch and line sizes are reduced, the greater the accuracy required for flex alignments. Most 100 to 120 micron pitch flex based test heads can function with tool accuracy at ±10 microns. Recent 75 micron pitch products require tool positioning accuracy less than or equal to 5 microns to achieve usable contact performance.

A final disadvantage is that Intensive Manual Alignments are required. With this current contact method it is required that manual mechanical alignments be performed for each contact trace tab group that exists on the product layout. This can range in tab group counts from as few as 16 to as many 104 individual alignments required for each product specific test head assembly. These alignments are generally repeatable after performing replacement of a test head for product swap, but at the least requires extra maintenance intervention time needed to verify these individual alignments.

What is desired is a new test method and test probe card that remedies the disadvantages found in the prior art methods and test probe cards as discussed above.

SUMMARY OF THE INVENTION

The present invention as described below provides temporary test contacts on high density contact features across large substrates with contact along on one or more of the perimeter edges. The test methods described below have the precision and performance of current probe card contact methods, but with much easier scalability and at a much lower cost than current wafer centric probe card technologies.

A Flexible Probe Card according to the present invention comprises of three main components that are laminated together with adhesive to function as one assembly. The Flexible Probe Cards according to the present invention have contact features patterned on a flexible circuit to exactly reproduce the contact features that are patterned on the product layouts being tested. Contact interface is performed by Z-axis conductors that are laminated to the flexible circuit board and allow signals to be passed from DUT to the patterned features on the flexible circuit board. Contact force is applied by a polyurethane backing layer that also corrects for flatness errors during probe card contacts.

A flexible probe card according to the present invention comprises a compression layer; a transport layer coupled to the compression layer; and a contact layer coupled to the transport layer. The contact layer is in contact with a device under test, which can comprise, for example, an image sensor device formed on a glass substrate. The compression layer can comprise encapsulated closed cell polyurethane foam. The transport layer comprises a plurality of connectors for coupling the flexible probe card to a tester. A spacing of a plurality of connectors on the transport layer mirrors a spacing associated with a plurality of connectors on the DUT. The contact interface layer comprises a plurality of conductive wires placed in a fixed grid pattern in a silicon rubber layer. The fixed pattern dimensions of the contact layer are of a sufficiently smaller pitch than the features present on the contact layer and the DUT. This pattern pitch reduction at the contact layer is what allows the signals to be passed only between the desired contact traces according to the present invention. The conductive wires can comprise gold, copper, or CuZn.

The flexible probe card of the present invention can be part of a testing system according to the present invention comprising a flexible probe card comprising a compression layer, a transport layer, and a contact layer; a device interface board ("DIB") in electrical communication with the flexible probe card; and a test control system in electrical communication with the device interface board.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The flexible probe card according to the present invention comprises three main components that are laminated together with adhesive to function as one assembly:

Backing or Compression Layer: This is the base layer for the assembly, and is custom manufactured for dimensions using an encapsulated closed cell polyurethane foam or equivalent that has all cut edges sealed for uniformity and reduced shedding. One material that can be used for this application is Poron microcellular urethane foam available from Rogers Corporation. This base layer is intended to provide two different solutions in the overall design of the Flexible Probe Card: first, it will provide the ability for the Flexible Probe Card to conform to the shape and flatness errors that exist along the length of the contact tab sets of the image sensor product glass substrate as it rests on a quartz test stage. Secondly, it will provide the compression needed to press conductors against the DUT contact tab sets. The compression factor of this material is very light when used with smaller overdrive (amount of travel after first physical contact of probe card is achieved) dimensions but this hardness, or compression factor, increases exponentially as the over travel range increases.

Transport Layer: This is the middle layer of the assembly and contains the connectors needed to interface probe cards to a Tester, and will also contain the identically patterned features that exist as the contact tab patterns present on product layouts. This material is best described and marketed as flexible printed circuit boards and is currently available, but currently not used or exploited for the application and method describe herein. There are multiple vendors providing this material in the marketplace currently. One such material is, for example, Dupont Pyralux flexible circuit material.

Contact Interface Layer: This layer provides the temporary contact surface which contacts the DUT trace lines. This technology is marketed as a Z-axis conductor, and is a series of conductive (ex. Au, Cu, CuZn, etc.) wires that are placed in a fixed grid pattern in a block of silicon; this block is then sliced into very thin layers (0.25 to 2.5 mm for average listed dimensional ranges). The conductive wires suspended in silicon film will then transfer electrical contacts in a Z-axis as long as there are conductive surfaces present both above and below this layer. An example of the material identified as is ShinEtsu Z-axis conductor material. One example of the conductor material includes 20 to 50 micron wire diameters placed at a 50 to 100 micron pitch in a square pattern. The suspension material is ideally Silicon rubber. The density of wires for a 30 micron wire on a 75 micron pitch, as an example, would be approximately 145,000 contacts per square inch. Those skilled in the art will realize that other dimensions and materials can be used in the contact interface layer.

Figure 1:
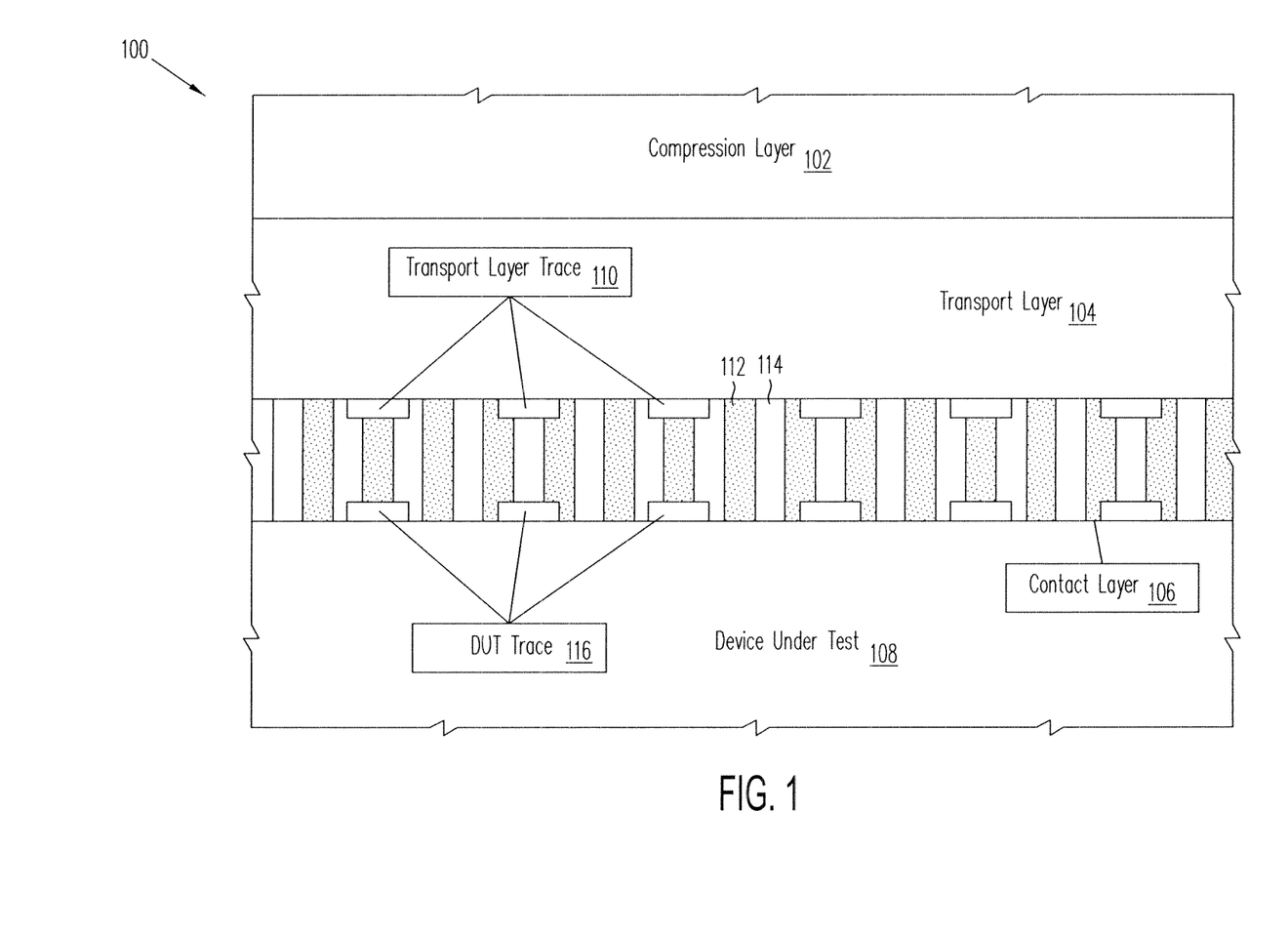
FIG. 1 illustrates a first cross-sectional view of a flexible probe card in contact with the DUT according to the present invention.

Referring now to FIG. 1, a first cross-sectional view of a flexible probe card 100 in contact with a DUT according to the present invention is shown. A compression layer 102 is shown laminated to transport layer 104, including a transport layer trace pattern 110. A contact layer 106 is laminated to transport layer 104, including a plurality of Z-axis conductors 112 as previously described in a silicon rubber layer 114 as was also previously described. The Z-axis conductors contact the DUT 108, which includes a DUT trace pattern 116 as shown. It will be apparent to those skilled in the art that the Z-axis conductors as shown are not necessarily to scale and the density of these Z-axis conductors can be different than as depicted in FIG. 1.

Figure 2:
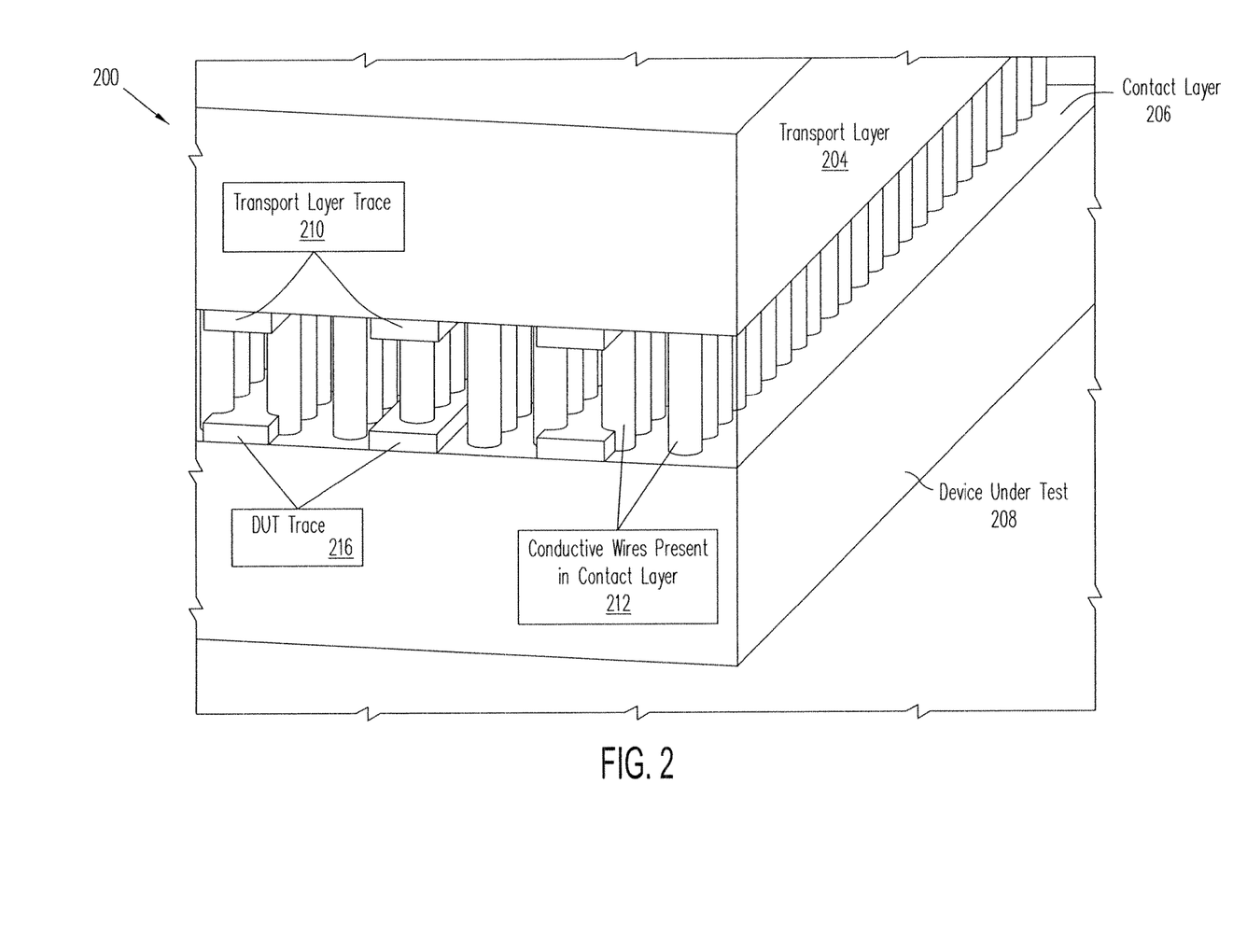
FIG. 2 illustrates a second cross-sectional view of a flexible probe card in contact with the DUT according to the present invention.

Referring now to FIG. 2, a second cross-sectional view of a flexible probe card 200 in contact with a DUT according to the present invention is shown. The compression layer is omitted for sake of clarity in this view. Transport layer 204, however, is shown including a transport layer trace pattern 210. A contact layer 206 is laminated to transport layer 204, including a plurality of Z-axis conductors 212 as previously described in a silicon rubber layer as was also previously described. The Z-axis conductors contact the DUT 208, which includes a DUT trace pattern 216 as shown. It will be apparent to those skilled in the art that the Z-axis conductors as shown are not necessarily to scale and the density of these Z-axis conductors can be different than as depicted in FIG. 2.

Figure 3:
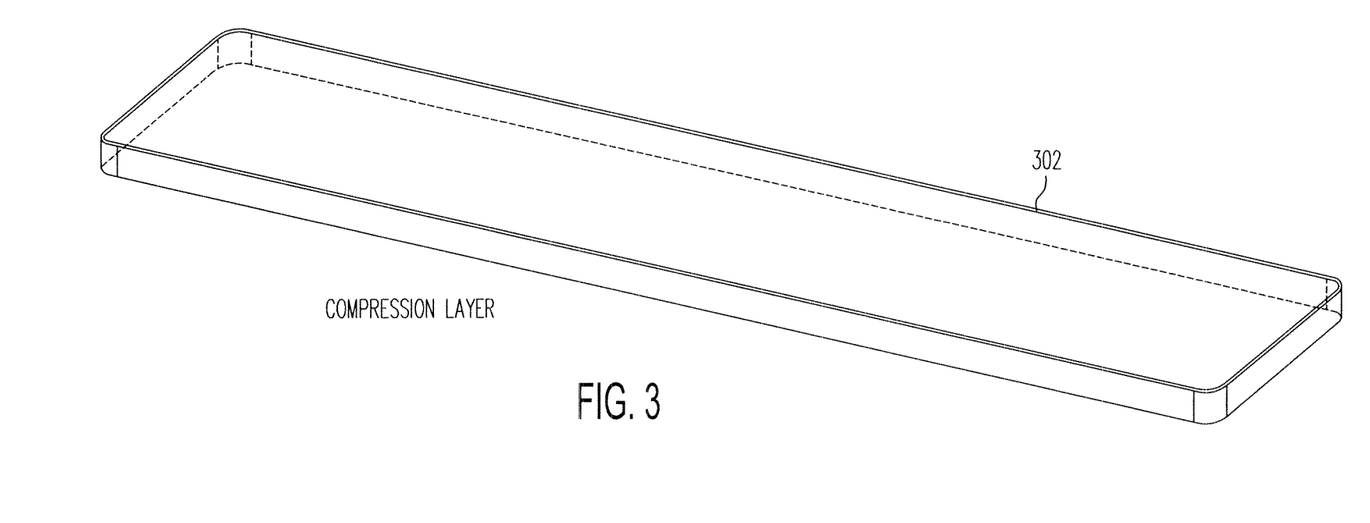
FIG. 3 further illustrates the compression layer according to the present invention.

Referring now to FIG. 3, the un-laminated compression layer 302 is shown in greater detail. In an embodiment, typical dimensions for compression layer 302 include a width of 75 to 100 mm, a length of 130 to 430 mm, and a thickness of 1.0 to 3.5 mm.

Figure 4A:
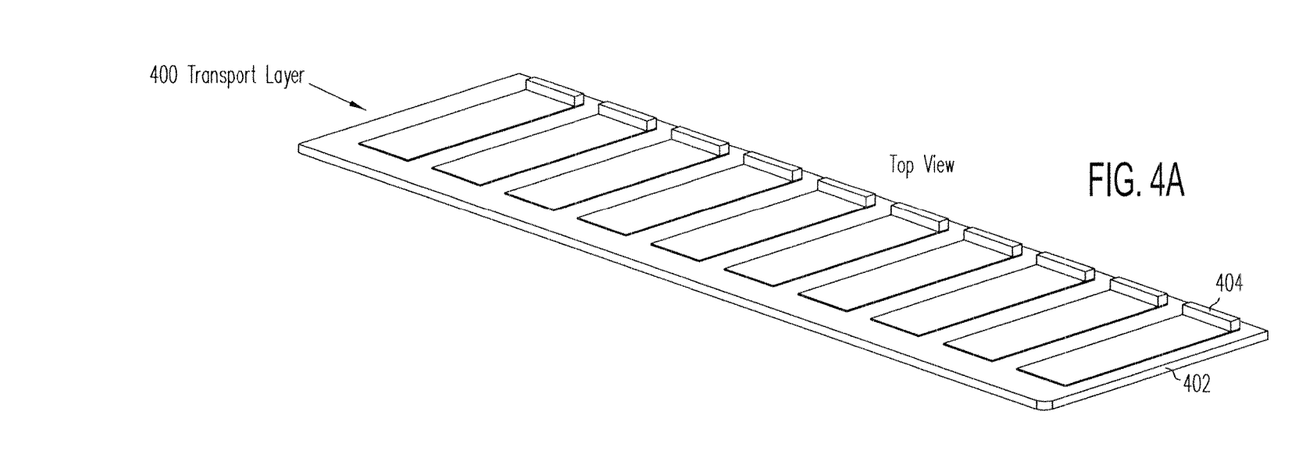
FIGS. 4A and 4B further illustrate the transport layer according to the present invention.
Figure 4B:
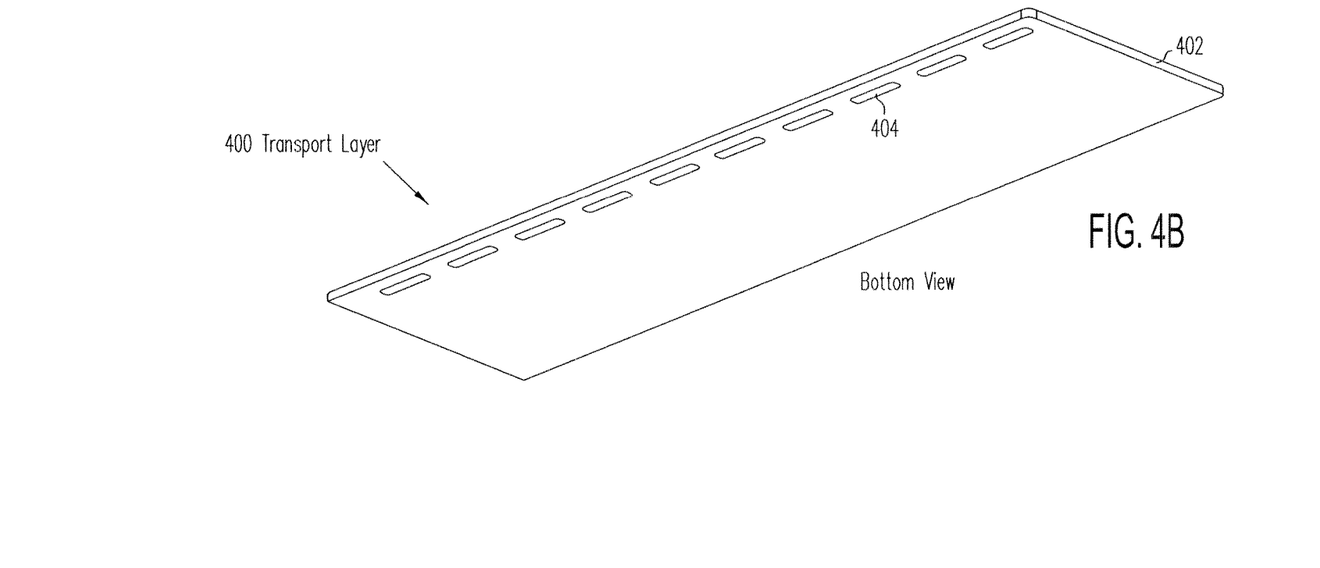

Referring now to FIGS. 4A and 4B, the un-laminated transport layer shown includes a base layer 402 made of the flexible material previously discussed, as well as top and bottom views of a trace pattern 404 that mirrors the trace pattern of the DUT. In an embodiment, typical dimensions of the base layer 402 include a width of 75 to 100 mm, a length of 130 to 430 mm, and a thickness of 1.0 to 3.5 mm. The height of the portion of the trace pattern 404 extending above the plane of the base layer 402 is about 0.000 to 0.025 mm, and the spacing between individual traces in trace pattern 404 is about 0.030 to 0.075 mm.

Figure 5:
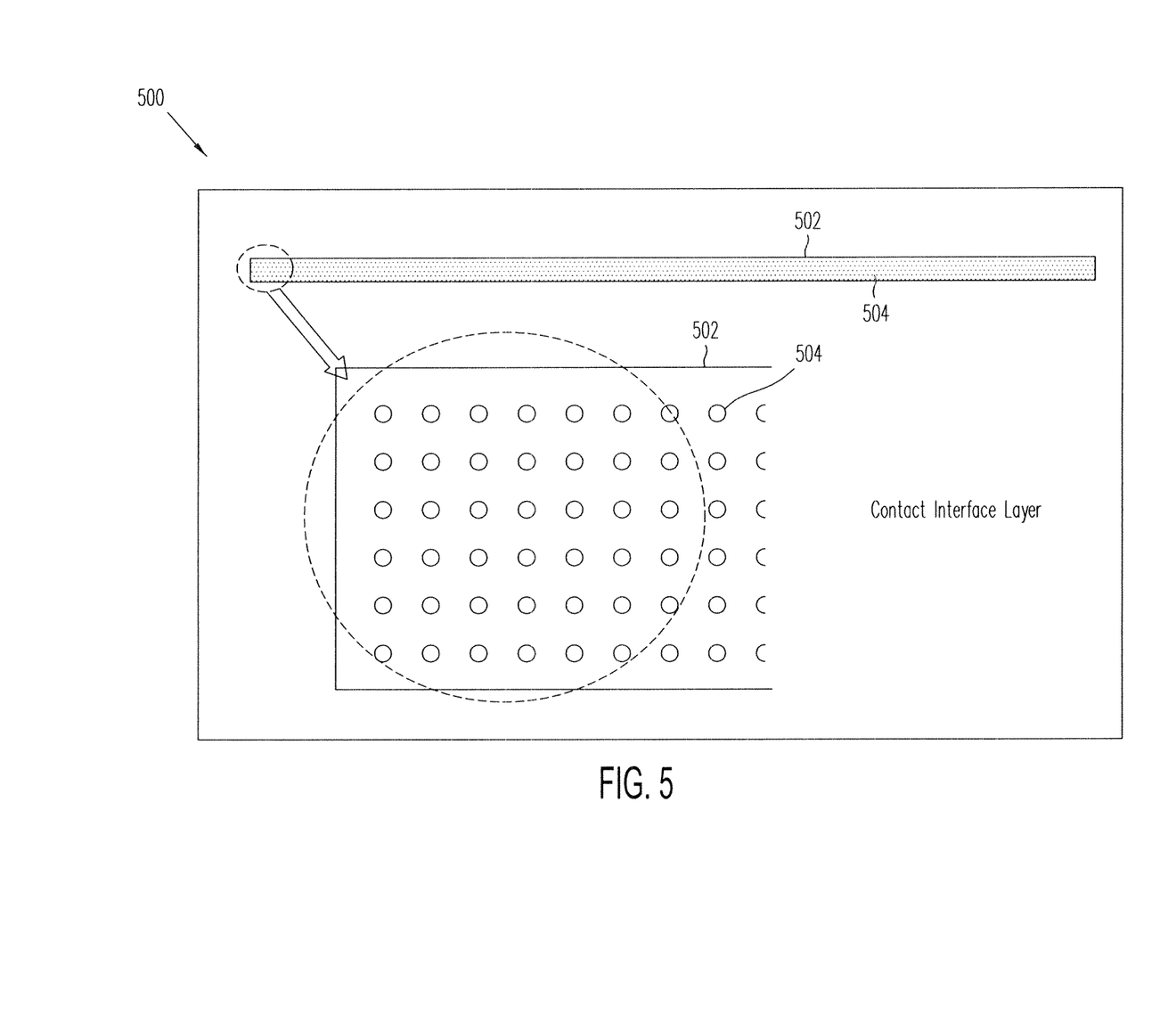
FIG. 5 further illustrates the contact layer according to the present invention.

Referring now to FIG. 5, the contact layer 500 is shown as including a silicon rubber layer 502 about 25 mm thick as previously discussed, including Z-axis conductors 504 with a density of about 145,000 contacts per square inch as previously discussed. In FIG. 5, both a cross-sectional view of the contact layer 500 is shown, as well as plan view of a portion of the contact layer is shown in greater detail.

Figure 6A:
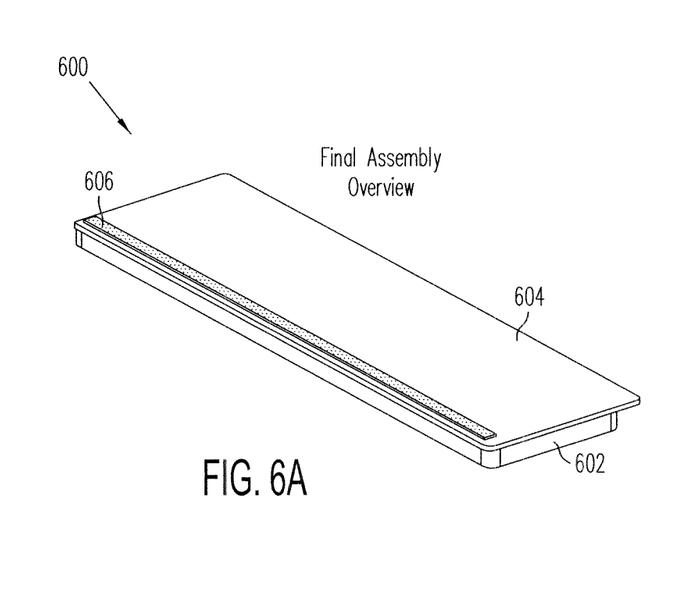
FIGS. 6A and 6B illustrates a final assembly overview of the flexible probe card according to the present invention.
Figure 6B:
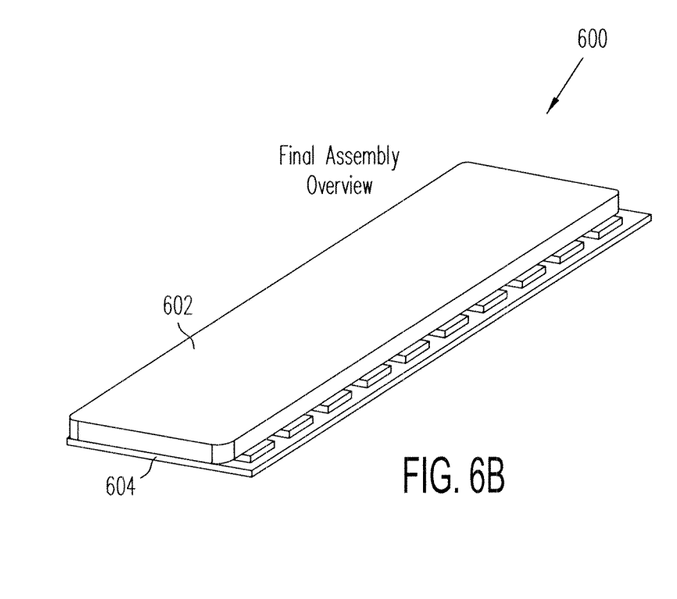

Referring now to FIGS. 6A and 6B, a final assembly overview 600 of the flexible probe card of the present invention is shown. The two main components shown are the compression layer 602, the transport layer 604, and the contact layer 606. Final assembly is accomplished using adhesive lamination.

Figure 7:
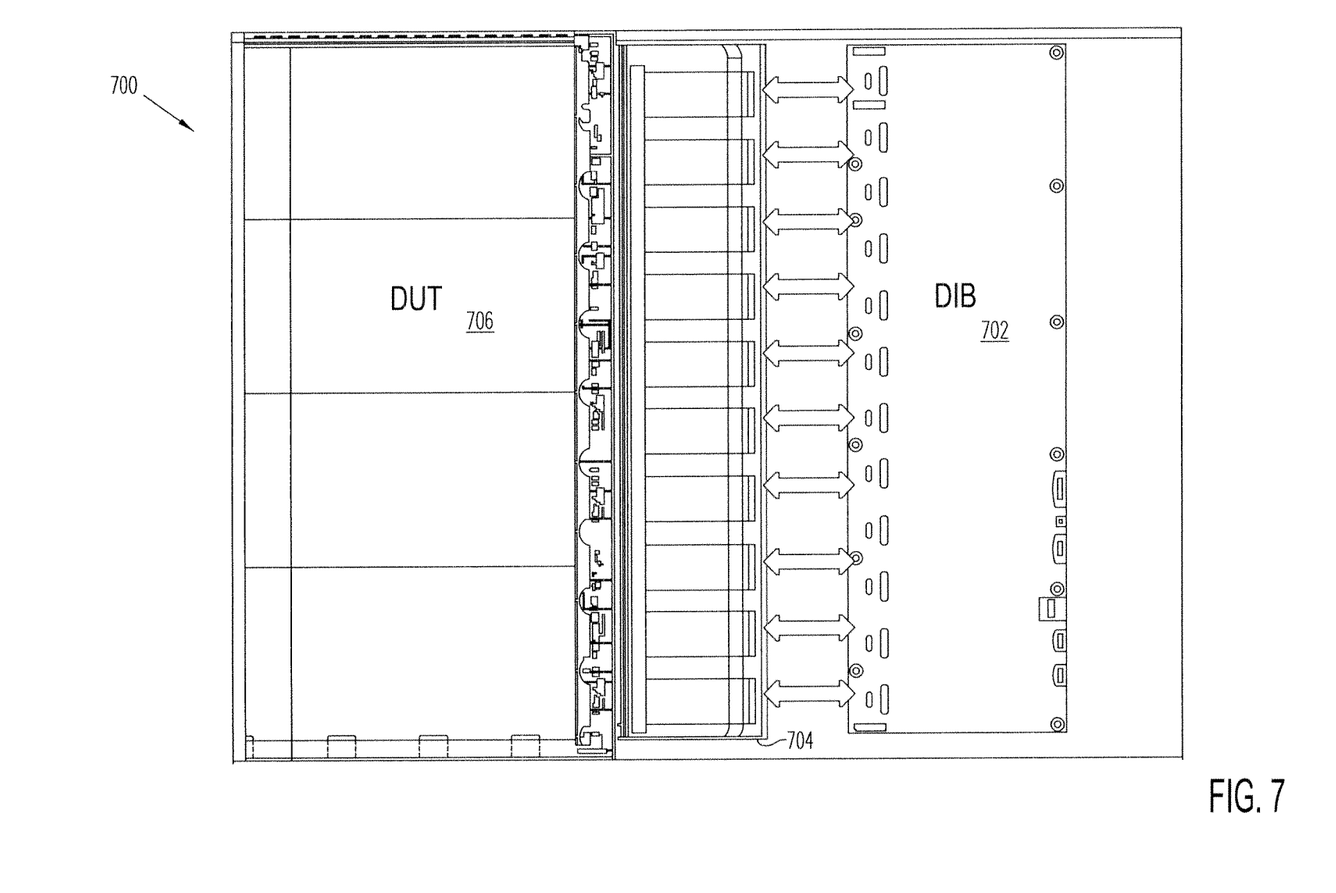
FIG. 7 illustrates in an exploded view a final assembly shown to perform temporary electrical contact on the DUT and to pass signals to the DIB according to the present invention.

Referring now to FIG. 7, a final assembly is shown to perform temporary electrical contact on the DUT and to pass the signals to the DIB. Depicted separately in FIG. 7 are the DIB 702, the flexible test card 704, and the DUT 706 according to the present invention.

Figure 8:
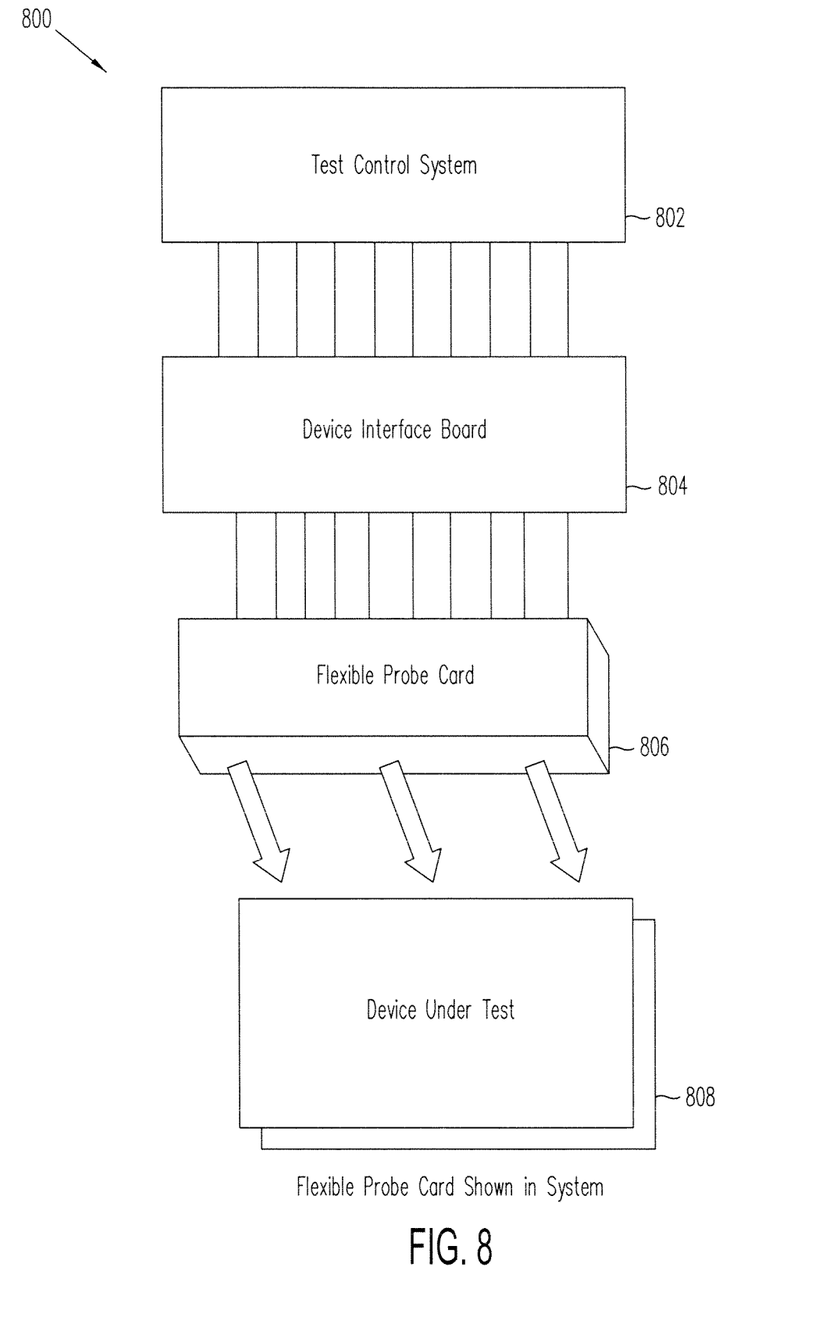
FIG. 8 illustrates a block diagram of a testing system according to the present invention.

Referring now to FIG. 8, a flexible probe card 806 according to the present invention is shown in a test system 800 including a test control system 802 in communication with a device interface board 804, which is in turn in communication with the flexible probe card 806. The flexible probe card is used to test the DUT 808 as was previously discussed. The test control system 802 can be, for example, a Windows-based PC with imaging software, such as VIVA software from Varian Medical Systems, and is responsible for image acquisition, control, and post processing in test system 800. The device interface board 804 can be, for example, a Varian Paxscan 4336W Digital Image Receptor, and is responsible for timing and control of, as well as interpreting signal levels on individual read-out lines in test system 800.

The method of the present invention is now explained, and also particularly with reference to drawings FIGS. 9-12 in further detail below. In general, the flexible probe card of the present invention is mounted to the bottom of a test fixture frame, and cable to the DIB. The DUT is positioned on a quartz stage. The quartz stage is located so that the DUT is located directly underneath the test fixture frame. The test fixture framework is lowered to a point just before contacting the DUT, which allows a bottom-up view from cameras located underneath the quartz stage. The bottom-up view includes both the contact features of the DUT and the contact features of the flexible probe card of the present invention. This test intermediate test position is used for alignment of the flexible probe card of the present invention and also for fine positioning of the DUT before testing. After proper alignment has been completed, the test fixture frame is moved into final test position. A typical range downward travel after initial contact with the DUT is about 0.020 to 0.150 mm. The position of the test fixture after contact combined with the compression factors of the polyurethane compression layer provide all of the downward force required for successful test contact performance.

Figure 9:
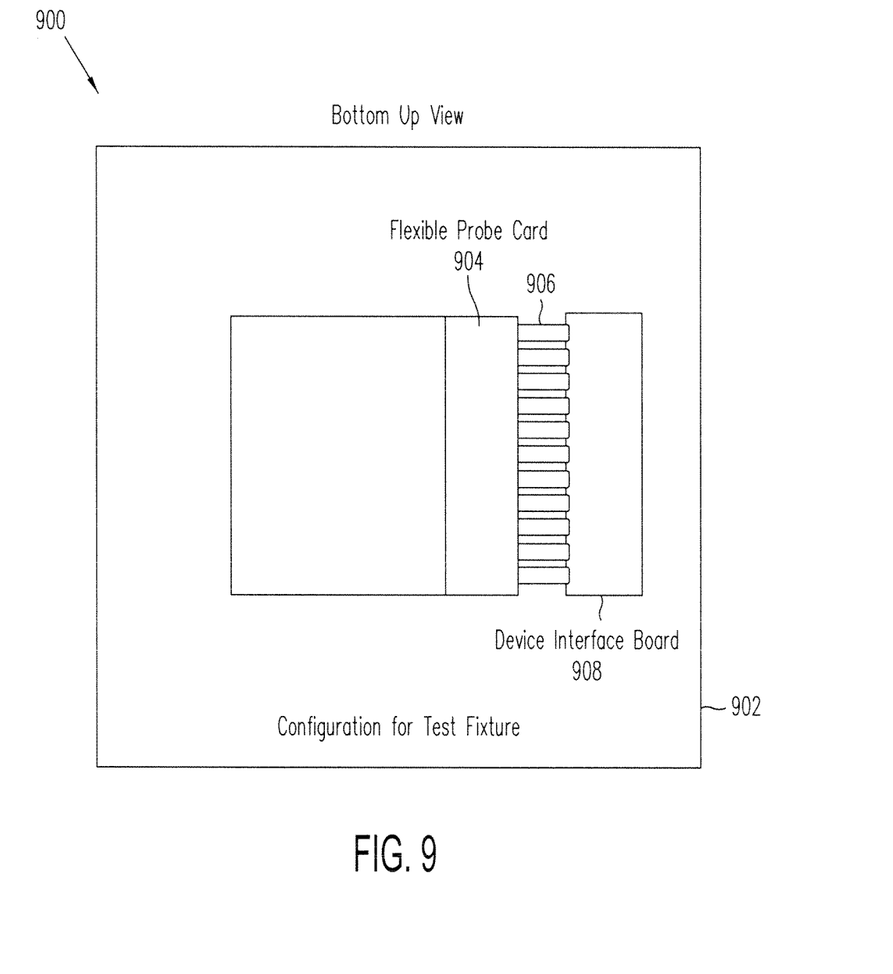
FIGS. 9-12 illustrate a test environment for implementing the test method of the present invention.

Referring now to FIG. 9, a bottom-up view of a test fixture 900 according to the present invention includes a test fixture frame 902, a flexible probe card 904, interconnects 906, and a device interface board 908. The flexible probe card 904 is mounted in front of the DIB 908. Flex connectors 906 that had been used for providing contacts to the DUT are now used as interconnects between the flexible probe card 904 and the DIB 908. Exposed traces on the DUT (not shown in FIG. 9) are contacted by the front edge of the flexible probe card assembly. Compression against the DUT for temporary electrical contacts is achieved by vertical travel of the test fixture and the compression factors of the polyurethane compression layer of the flexible probe card 904.

The flexible probe card according to the present invention can be mounted along one perimeter edge, or on all four edges if desired. The flexible probe card can be made modular or scalable to accommodate a wide range of testing environments and applications. Also, the flexible probe card according to the present invention in application is not limited to testing glass panel devices. The flexible probe card could be used to provide temporary test contacts on wide range of manufactured devices such as flexible devices or any device with a circuit card face to contact. Referring to FIG. 9, the bottom up view shows one flexible probe card for contacting the DUT, which can be expanded to incorporate a flexible probe card along any or all edges of the DUT. Ideally, there is only one flexible probe card per side used for reduced build costs and reduced setup and maintenance times.

Figure 10:
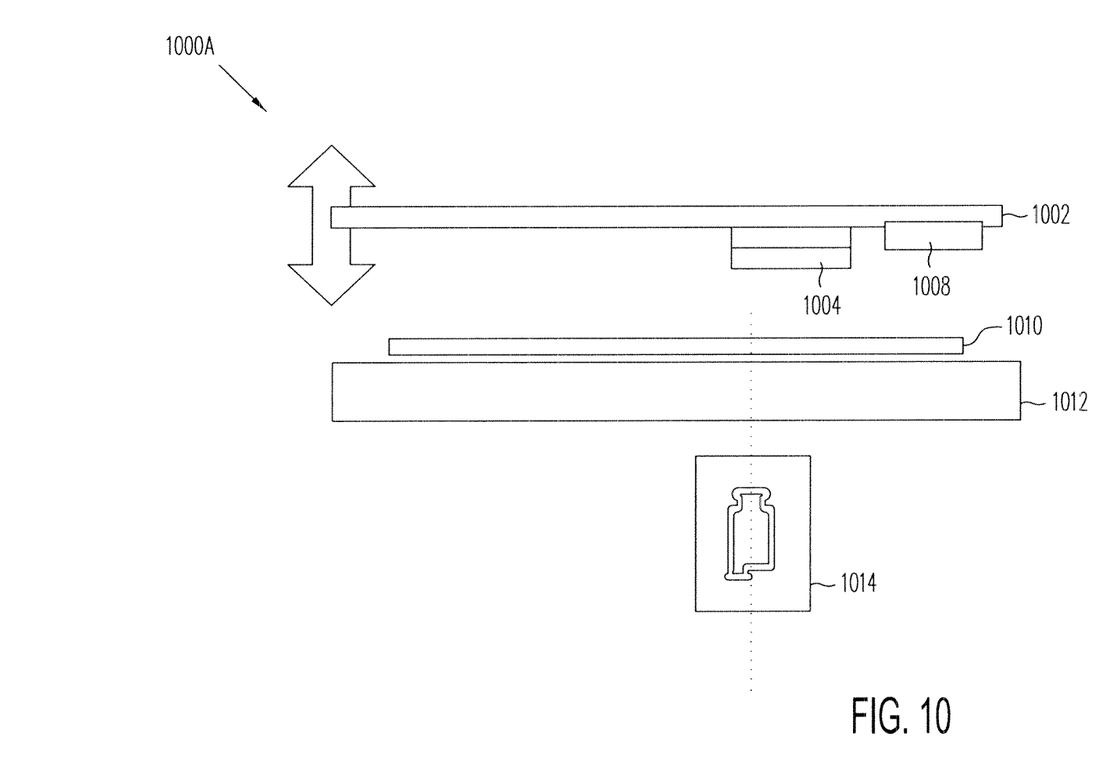
Figure 11:
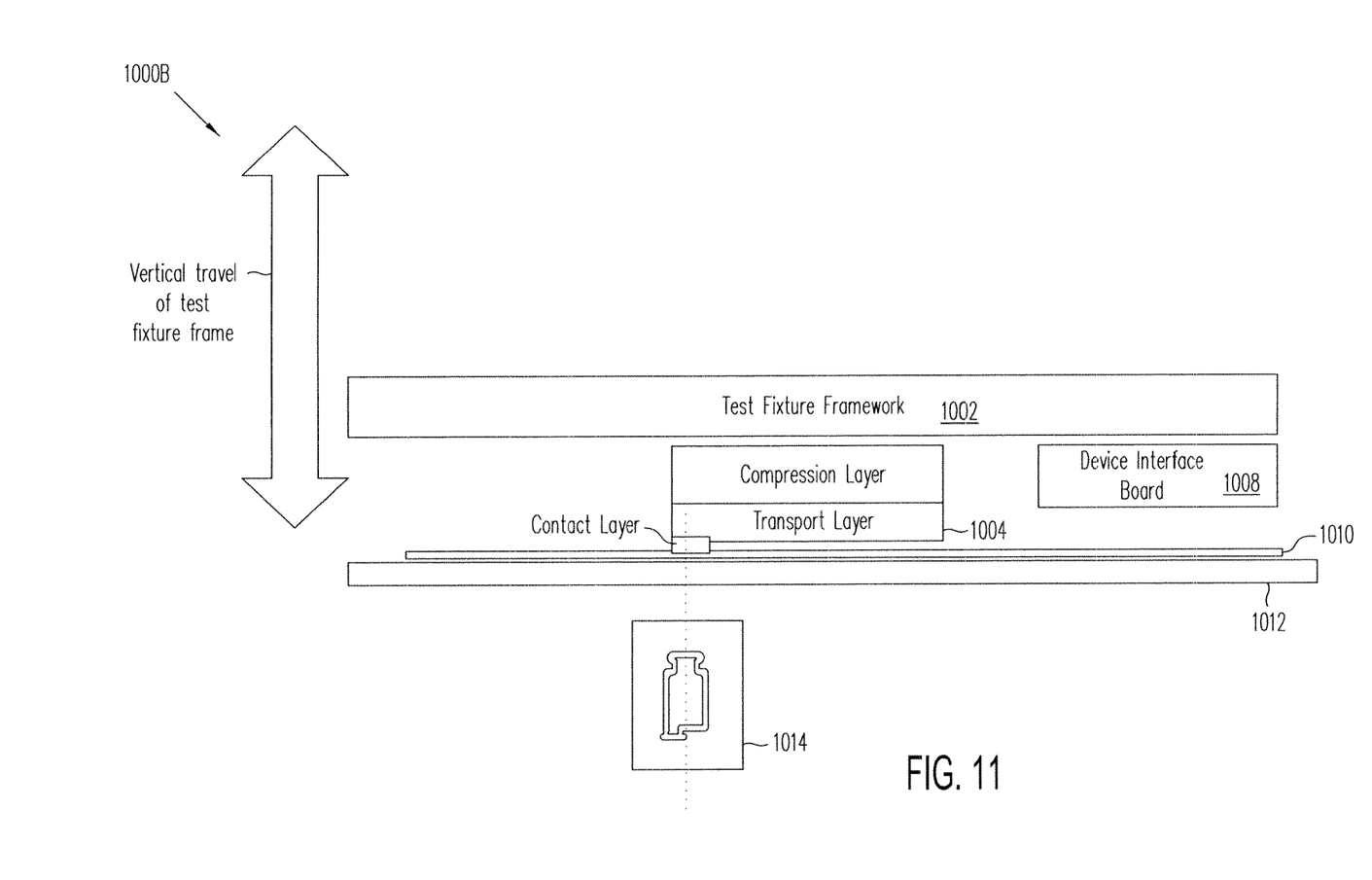
Figure 12:
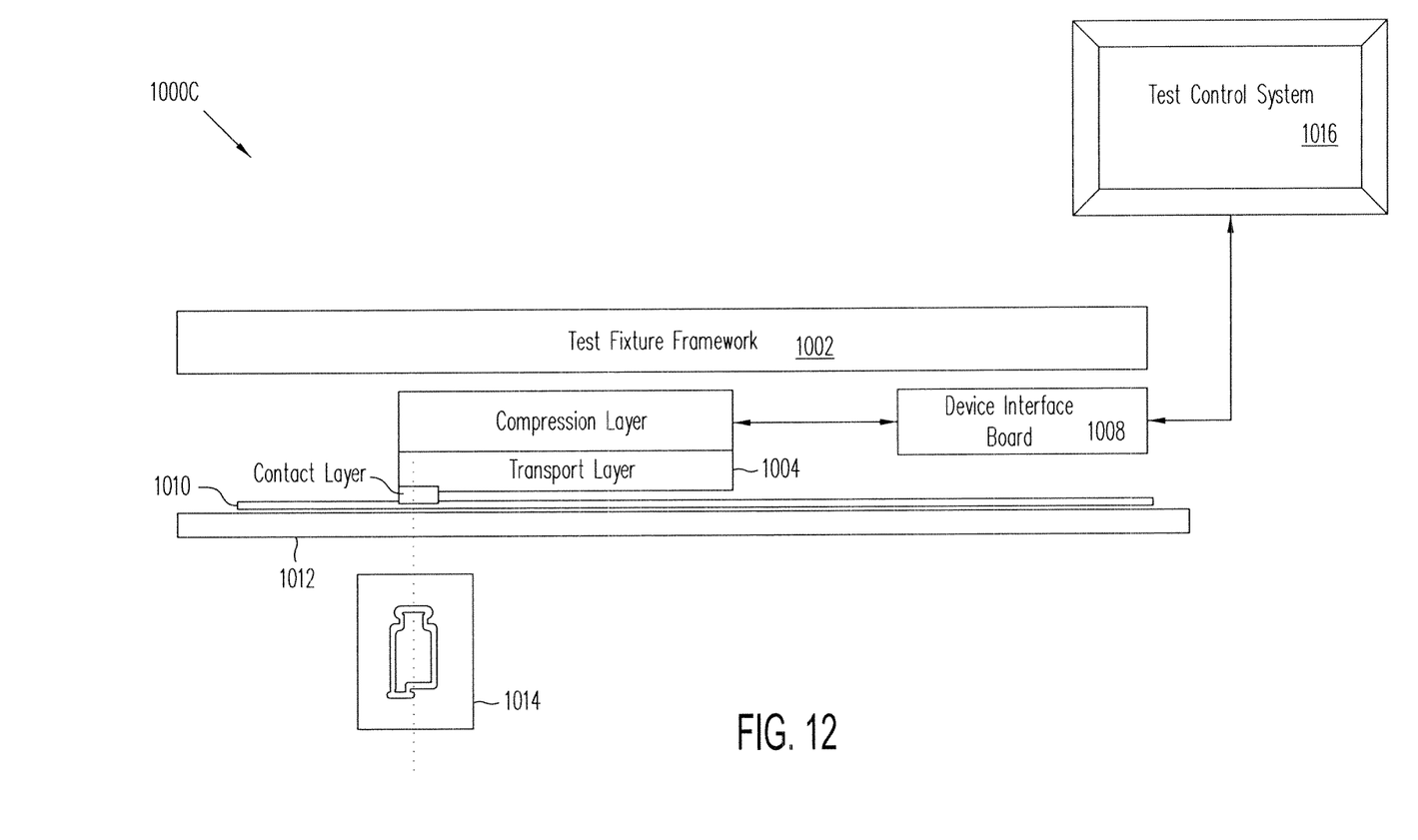

FIGS. 10-12 show cross-sectional views of the test fixture of the present invention. FIG. 10 shows the test fixture 1000A in an intermediate position wherein the flexible probe card of the present invention is not in contact with the DUT. FIGS. 11 and 12 show the test fixture 1000B and 1000C in a final contact position wherein the flexible probe card of the present invention is in electrical contact with the DUT.

Referring now to FIG. 10, a test fixture frame 1002, a flexible probe card 1004, a DIB 1008, a DUT 1010, a quartz stage 1012, and a video alignment camera 1014 are shown in the intermediate position.

Referring now to FIG. 11, the same test fixture elements are shown in the final electrical contact test position described above.

Referring now to FIG. 12, the same test fixture elements are shown in the same final test position, however, the electrical signal path between the flexible probe card 1004, the DIB 1008, and a test control system 1016 are also shown.

It is an advantage of the present invention that there is, with respect to prior art test methods, low cost per contact line, more margin in chuck and substrate height variation, better alignment capability on tighter pitch, easily scalable to large area (greater than 300 mm) substrates, and is well suited for testing devices with interconnects on more than one side.

The flexible probe card according to the present invention serves as a low cost alternative to traditional mechanical probe cards with improved contact performance compared to current low cost flexible circuit temporary contact solutions.

In summary, the Flexible Probe Card of the present invention comprises multiple layers that work together to compensate for non-flatness errors of DUT stage systems. An example system embodiment according to the present invention includes a Base layer made from closed cell Polyurethane, a Transport layer made from flexible circuit board material, and a contact layer that uses a Z-axis interconnect o provide electrical contact between a DUT and the transport layer circuit board.

The Flexible Probe Card design according to the present invention realizes significant cost savings potential from using patterned circuit board for mechanical accuracy rather than complicated mechanical build and alignment of traditional probe cards.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed. As but one example, many of the dimensions described herein can be changed to conform to a particular application. As another example, the materials described herein can be substituted to conform to a particular application. Finally, the exact test fixture configurations described herein can also be changed to accommodate various DUTs as required.

We claim:

1. A flexible probe card comprising:
   in an uncompressed state of the flexible probe card,
   a compression layer comprising a substantially planar first surface and a substantially planar second surface;
   a transport layer comprising a substantially planar first surface and a substantially planar second surface, wherein the entirety of the substantially planar first surface is directly coupled to the entirety of the substantially planar second surface of the compression layer; and
   a contact layer comprising a substantially planar first surface and a substantially planar second surface, wherein the entirety of the substantially planar first surface is directly coupled to the entirety of the substantially planar second surface of the transport layer.

2. The flexible probe card of claim 1, wherein the contact layer is in contact with a device under test.

3. The flexible probe card of claim 2, wherein the device under test comprises an image sensor device.

4. The flexible probe card of claim 3, wherein the image sensor device further comprises a glass substrate.

5. The flexible probe card of claim 1, wherein the compression layer comprises encapsulated closed cell polyurethane foam.

6. The flexible probe card of claim 1, wherein the transport layer comprises a plurality of connectors for coupling the flexible probe card to a tester.

7. The flexible probe card of claim 2 wherein a spacing of a plurality of connectors on the transport layer mirrors a spacing associated with a plurality of connectors on the device under test.

8. The flexible probe card of claim 1, wherein the contact layer comprises a plurality of conductive wires placed in a fixed grid pattern in a silicon rubber layer, wherein the fixed grid pattern of the contact layer is of a smaller pitch than a spacing associated with a plurality of connectors present on the contact layer and a spacing associated with a plurality of connectors present on the device under test.

9. The flexible probe card of claim 8 wherein the conductive wires comprise gold, copper, or CuZn.

10. A testing system comprising:
    a flexible probe card comprising a compression layer, a transport layer, and a contact layer;
    a device interface board in electrical communication with the flexible probe card; and
    a test control system in electrical communication with the device interface board,
    wherein, in an uncompressed state of the flexible probe card, the compression layer comprises a substantially planar first surface and a substantially planar second surface; the transport layer comprises a substantially planar first surface and a substantially planar second surface, wherein the entirety of the substantially planar first surface is directly coupled to the entirety of the substantially planar second surface of the compression layer; and the contact layer comprises a substantially planar first surface and a substantially planar second surface, wherein the entirety of the substantially planar first surface is directly coupled to the entirety of the substantially planar second surface of the transport layer.

11. The testing system of claim 10, wherein the contact layer comprises a plurality of conductive wires placed in a fixed grid pattern in a silicon rubber layer.

12. The testing system of claim 10, wherein the contact layer is in contact with a device under test.

13. The testing system of claim 12, wherein the device under test comprises an image sensor device.

14. The testing system of claim 13, wherein the image sensor device further comprises a glass substrate.

15. The testing system of claim 10, wherein the compression layer comprises encapsulated closed cell polyurethane foam.

16. The testing system of claim 10, wherein the transport layer comprises a plurality of connectors for coupling the flexible probe card to a tester.

17. The testing system of claim 10, wherein the conductive wires comprise gold, copper, or CuZn.

18. The testing system of claim 12, wherein a spacing of a plurality of connectors on the transport layer mirrors a spacing associated with a plurality of connectors on the device under test.

19. A flexible probe card comprising:
    a compression layer comprising encapsulated closed cell polyurethane foam;

a transport layer coupled to the compression layer comprising a flexible circuit material, a plurality of connectors configured to interface to a tester, and a plurality of contacts mirroring a plurality of contacts of a device under test; and a contact layer coupled to the transport layer comprising a plurality of contact wires arranged in a square pattern and suspended in silicon rubber configured for contacting the plurality of contacts of the device under test and for contacting the plurality of contacts of the transport layer.

20. The flexible probe card of claim 19, wherein, in an uncompressed state of the flexible probe card, the compression layer, the transport layer, the contact layer, an interface region between the compression layer and the transport layer, and an interface region between the transport layer and the contact layer are all substantially planar.

* * * * *